US006891310B2

(12) United States Patent
Beckwith

(10) Patent No.: US 6,891,310 B2
(45) Date of Patent: May 10, 2005

(54) NEUTRINO LIGHT TO PHOTON LIGHT CONVERTING MATRIX

(76) Inventor: Robert W. Beckwith, 2794 Camden Rd., Clearwater, FL (US) 33759

(*) Notice: Subject to any disclaimer, the term of this patent is extended or adjusted under 35 U.S.C. 154(b) by 130 days.

(21) Appl. No.: 10/607,402

(22) Filed: Jun. 26, 2003

(65) Prior Publication Data

US 2004/0027031 A1 Feb. 12, 2004

Related U.S. Application Data

(63) Continuation-in-part of application No. 09/354,282, filed on Jul. 15, 1999, now abandoned
(60) Provisional application No. 60/093,477, filed on Jul. 20, 1998.

(51) Int. Cl.[7] .............................................. H01L 41/08
(52) U.S. Cl. ........................ 310/311; 310/319; 310/328
(58) Field of Search ......................... 310/311, 322.328, 310/334, 317, 319

(56) References Cited

U.S. PATENT DOCUMENTS

| | | | | | |
|---|---|---|---|---|---|
| 3,629,582 | A | * | 12/1971 | Koehler et al. | 250/363.01 |
| 4,205,268 | A | * | 5/1980 | Eerkens | 455/899 |
| 4,303,343 | A | * | 12/1981 | Patel et al. | 356/432 |
| 4,385,634 | A | * | 5/1983 | Bowen | 600/407 |
| 4,576,777 | A | * | 3/1986 | Weber | 376/153 |
| 5,070,702 | A | * | 12/1991 | Jackson | 62/610 |
| 5,198,181 | A | * | 3/1993 | Jacobson | 376/132 |
| 5,276,717 | A | * | 1/1994 | Weber | 376/156 |
| 6,004,257 | A | * | 12/1999 | Jacobson | 600/9 |
| 6,832,251 | B1 | * | 12/2004 | Gelvin et al. | 709/224 |

* cited by examiner

*Primary Examiner*—Mark Budd
(74) *Attorney, Agent, or Firm*—Leo J. Aubel

(57) ABSTRACT

Apparatus for viewing in neutrino light first uses microwaves to create neutrino force differentials on piezoelectric material. The force differentials are used by elements of a matrix to create pixels of a two dimensional picture for use in viewing of underground structures from a satellite. In another form pixels are formed on an LCD display for direct human viewing.

8 Claims, 6 Drawing Sheets

Electromagnetic Wave Packet

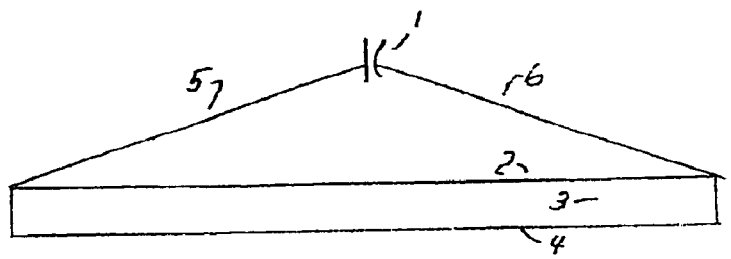
Fig. 5
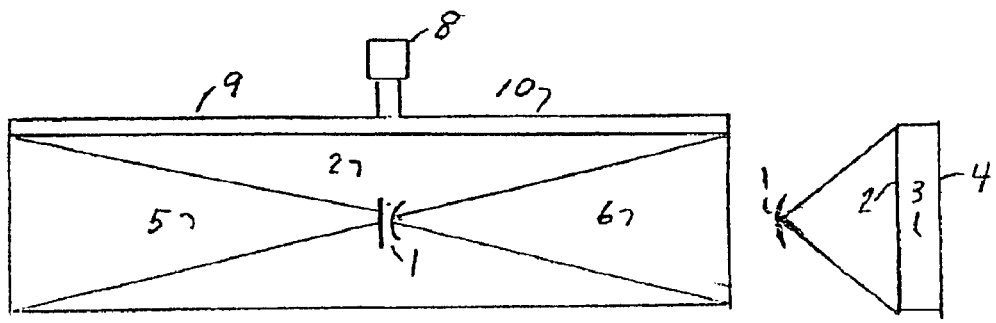
Fig. 6a
Fig. 6b
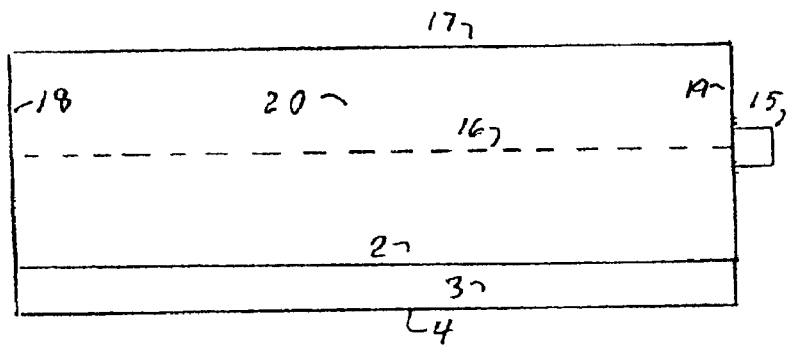
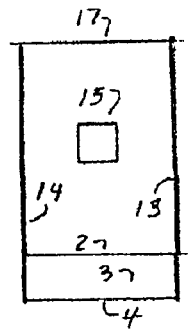
Fig. 7a
Fig. 7b
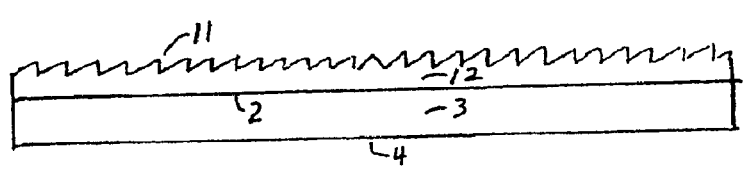
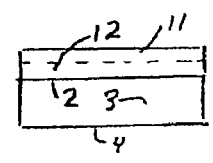
Fig. 8a
Fig. 8b

NEUTRINO LIGHT TO PHOTON LIGHT CONVERTING MATRIX

This is a Continuation-In-Part Patent Application on patent application Ser. No. 09/354,282 entitled DIRECT USES OF NEUTRINO ENERGY filed on Jul. 15, 1999 now abandoned, which in turn claims the priority date of Provisional Patent Application No. 60/093,477, entitled A NEUTRINO POWERED BATTERY CHARGER FOR ELECTRIC AUTOMOBILES, filed on Jul. 20, 1998.

A NEW LAW OF NATURE

This patent application is based on acceptance of the following new law of nature:

A FORCE MODEL OF THE UNIVERSE AND THE ROLE OF NEUTRINOS

PREFACE

Electrical engineers use six dimensions in their every day design of motors and generators. These rules of engineering are given a rigid foundation in Chapter 1 as used in designing AC motors and generators. This is "old hat" to motor and generator design engineers. When applied to the universe and then to neutrinos, surprising theories emerge. To avoid boring repetition the words "We believe" are often omitted in this paper. To physicists studying neutrinos we say "Lets take another look!"

Chapter 1: The Six Dimensions of Engineering

Engineers use six orthogonal (all at right angles to each other) dimensions in their daily work with macro sized systems. These consist of three dimensions of space, a fourth one of time, a fifth one of electric fields and a sixth one of magnetic fields. For purposes of this description these dimensions are labeled x, y, z, T, E and H respectively.

FIG. 1 shows the familiar three dimensions of Euclidean space.

Time is a dimension familiar to all and is not otherwise illustrated herein. We do believe, however, that time extends from plus to minus infinity, and that the universe has always been here in the past and will always be here in the future. We do not believe the big bang theory is valid.

We believe that the universe repeatedly bursts into existence and then chaotically crunches back to a small but not infinitely small size. The universe has always been here!

FIG. 2 illustrates the E (or electric) field with the charge of neutrons at zero, electrons at negative one potential, electron pairs called isoelectroniums at minus two potential, protons at plus one potential and Cooper pairs at plus two potential. The quantum difference between any two items shown in FIG. 2 is one. This implies electric fields of greater potential have a quantum difference in value of one. This is conveniently quantized into the force produced by a single electron.

The magnetic field B produces forces H well known to the electrical engineer. The elusive magnetic unipole as a magnetic dual of the electron has been sought but so far without result. Nevertheless it is convenient for the theories developed in this article to assume a quantum difference in magnetic field force equal to the force of a single electron but acting at a 90° angle in time. Our engineering theories support the existence of the quantum difference in magnetic fields. The existence of a unipole, as such, may not be required.

Further we believe there is no lower limit in size for the validity of our six dimensional model and related engineering theorems.

Chapter 2: A Force Model for the Universe

We hypothesize a model of the universe with forces explaining effects which are observed and used by engineers and others working in the macro world.

We hypothesize two fields of force lines emanating from the nucleus of all atoms in the universe. One is termed the "near" force lines and the other the "far" force lines. The polarized near lines from an atom repel other atoms so as to prevent atoms from destructively combining.

The non-polarized far lines act to pull atoms together with forces that diminish with distances between atoms. The atoms of our bodies are therefore pulled downward by all of the atoms of the Earth giving an effect which we call gravity. We do not believe that gravity otherwise exists. Our engineering theories, therefore, do not support the unified field theory with gravity as one of the fields.

We hypothesize that force lines carry electromagnetic waves of all frequencies from that of neutrinos through X-rays, light waves, radio waves and to waves of galactic dimensions. Force lines have the quantum spacing provided by the vector sum of the quantum force differences in the electric and magnetic fields.

The quantum difference in the electric field force is known to be that of a single electron. With natures natural tendency towards symmetry, it is reasonable that the quantum of magnetic field force is also equal to that of one electron. This then gives a measure of the unipole, if indeed there is such a thing.

Well known theories of electrical engineering tell us that the electric E field force is orthogonal to the magnetic H field force. Far force lines are then separated into quantum tubes of electric field and magnetic field forces. The radius of a tube is the vector sum of the E and H forces. The E and H forces may rotate at frequencies of waves guided in direction by far force line tubes.

The far force lines form a force model of the universe applicable from objects on Earth upward throughout the entire universe. The universe is filled with a media consisting of far force lines linking all atoms in the universe. Since each atom sources a very large integer-number of far force lines one must think in terms of far force line density in a redefinition of aether (ether). Aether is the most dense inside of a heavy solid and the least dense in deep intergalactic space.

Science wonders about the composition of dark matter. This may well be outside of the universe with no force lines at all. We cannot see dark matter because it does not exist! Light cannot go there since there are no far force lines for it to follow. All of the lines of force have an outer boundary pulling the universe together, eventually to the next big crunch at the end of our universe.

But how about electromagnetic fields? There is nothing to keep them from going outside of the universe. How far? Would not their frequency band be from that of neutrinos to that of galactic wavelengths?

What is the effect of magnetic fields within the universe with periods of a day? A year? A light year? Do these not drive elements of the universe the same way that fields of a motor turns the motor? How do these fields effect the structure of the universe. Are the fields causing continual changes in the universe?

Clearly the universe can only be modeled by using the four dimensions of x, y, and z of space together with the fourth dimension t of time. The universe can not be modeled as an expanding ball with changes in time assumed to be the same in all of the directions that we look. Again we can not support this overly simplified expanding ball model of present science.

Do not force lines from Earth to the ends of the universe go in straight lines? Could far force line detectors be used to see the universe as it is today in Earth time?

Non rotating electric and magnetic fields produce force fields having a direction. How do these directional forces interact with the non-directional force fields between atoms?

We assume that non rotating electric E field force lines are surrounded by a quantum tube with a radius equal to the force of one electron. We also assume that non rotating magnetic H field force lines are surrounded by a quantum tube with a radius assumed equal to the force of one electron. Since the E field and an H field force line do not exist in a single tube and do not vary in time, the 90° separation in time between E and H obviously does not exist.

In an experiment with magnetic levitation, magnetic tubes with stationary directional forces upward are mixed with non directional far force tubes between atoms of objects and atoms of the Earth. All of these force tubes are held apart in space by quantum forces. When the number of stationary magnetic force lines exceeds the number of non-directional far force lines, objects of any nature (even live frogs that are surrounded by the magnetic force lines) are levitated!

Electromagnetic energy from 60 Hz to photons and neutrinos follow force lines which rotate in the E/H fields at the frequency of the waves so as to guide them in the direction of force lines.

Electric power 60 Hz waves follow three phase power lines in the direction of positive-phase-sequence currents. These currents add to a Poynting's vector which provide a force in the direction of power flow along the lines as required to cause the power to flow in the desired direction.

The IEEE 100 Authoritative Dictionary of standard terms, seventh edition provides the following useful references:

1. "positive-phase-sequence symmetrical components (of a unsymmetrical set of polyphase voltages or currents of m phases). The set of symmetrical components that have the first phase sequence. That is, the angular phase lag from the first member of the set to the second, from the first member of the set to the second, from every other member of the set to succeeding one, and from the last member to the first, is equal to the characteristic phase difference, or $2\pi/m$ radians. The members of this set will reach their positive maxima uniformly in their designated order. The positive-phase-sequence symmetrical components for a three-phase set of unbalanced sinusoidal voltages (m=3), having the primitive period.

$$e_{a1} = (2)^{1/2} E_{a1} \cos(wt + \alpha_{a1})$$

$$e_{a1} = (2)^{1/2} E_{a1} \cos(wt + \alpha_{a1} - 2\pi/3)$$

$$e_{a1} = (2)^{1/2} E_{a1} \cos(wt + \alpha_{a1} - 4\pi/3)$$

derived from the equation of symmetrical components of a set of polyphase (alternating) voltages. Since in this case r=1 for every component (of the first harmonic) the third subscript is omitted. Then k is 1 for the 1st sequence and s takes the algebraic values 1, 2, and 3 corresponding to phases a, b, and c. The sequence of maxima occurs in the order a, b, c."

2. "If there is a flow of electromagnetic energy into or out of a closed region, the rate of flow of this energy is, at any instant, proportional to the surface integral of the vector product of the electric field strength and the magnetizing force. The vector product is called the Poynting's vector. If the electric field strength is E and the magnetic force is H, then Poynting's vector is given by $$U = E \times H \text{ and } U = E \times H / 4\pi$$

in rationalized and unrationalized systems, respectively. Poynting's vector is often assumed to be the local surface density of energy flow per unit of time."

FIG. 3 shows a generalized model explaining the flow of any electromagnetic wave along power lines, coaxial cables, twisted pairs of copper wires and along far force lines anywhere in free space. The force rotates around a circle with phasors rotating around a central direction giving the instantaneous phase relation of the wave. Force Fd is the force component that drives the wave in the direction established by a bundle of force lines carrying the wave in some direction. Force Fd is the composite of force F rotated over one turn of the cycle of the wave.

Chapter 3: Applying Engineering to the Neutrino

Neutrinos are the only waves small enough to travel through single far force tubes giving them the ability to pass through material, including our bodies, undetected. It is only in the extremely rare occasion when a far force tube carrying a neutrino precisely links up with a near force line tube that a neutrino can reach the nucleus of an atom and blow it up. It is only due to the very large number of neutrinos flowing that this ever occurs in experiments.

With all other approaches to an atom, the neutrino follows a far force line in and bounces off the atom giving a nudge to its Brownian motion. The neutrino then reflects along a far force line leaving the atom. The neutrinos do not go straight through material but bounce around gathering information.

All other electromagnetic waves are larger in size and require a bundle of force tubes to guide them in the direction they are to travel. All other waves are too large to annihilate an atom by simply shining on the atom. Light waves do shine with forces that can be observed in space. One example is the force that light appears to exert on Phoebe, a satellite of Saturn.

In discussing the moon Phoebe of Saturn, author Robert Temple of the UK states in his book The Sirius Mystery: "If Phoebe is a blown-up sphere, it will have very low density and will have an orbital precession due to solar light pressure."

While neutrinos are capable, with a very low probability, to destroy an atom, of greater interest in this article we look at the neutrino as a wave packet with varied characteristics.

We believe that neutrinos vary in frequency giving color to neutrino light, as detectable in certain experiments. Neutrinos may vary in length of packets with longer packets carrying greater energy. It may be that continuous coherent neutrino lasers can be formed.

FIG. 4 shows a wave representation of a neutrino. Fd is the composite of force F rotating at a quantum distance from Fd along the dotted path in space giving the direction of travel of a single neutrino packet.

Rotating force Fq is driven by neutrino energy stored on the E/H plane. Force F starts at point 1, where the neutrino energy exists as a negative voltage on the −E axis of an E/H plane. A quarter cycle later, force F is at point 2, and the neutrino energy exists as a positive current on the +B axis of the E/H plane. A second quarter cycle later, force F is at point 3, and the neutrino energy exists as a positive voltage on the +E axis of the E/H plane. A third quarter cycle later, the force F is at point 4, and the neutrino energy exists as a negative current on the −B axis of the E/H plane. A fourth quarter cycle later, force F is back at point 1 of FIG. 4 however the force F has moved one full neutrino period along the time axis. Note that FIG. 4 is an isometric depiction of rotation, in three dimensional space, of force F rotating within a quantum tube.

If a neutrino could be viewed as it comes directly towards you, the force would be seen moving in a circle. Conceptually, if one were small enough and stood in the path of the neutrino, one would be struck by force F from some point on the circle of the force rotation. The experience would be as if hit by a particle equal in diameter to the diameter of the neutrino force circle. The neutrino can, therefore, be said to have a physical size equal to the force diameter. We do not believe, however, as some others believe, that the neutrino has a dual existence, sometimes a wave, sometimes a mass. We believe that neutrinos always are a wave packet as described herein and that the electromagnetic wave model of FIG. 4 can be found to be consistent with present theories and experimental results as to the nature of neutrinos.

As is well known by radio engineers, the term FM is inexactly used to describe well known FM radio band transmissions. Actually phase modulation (PM) of a fixed carrier frequency is used which produces an equivalent frequency modulation (FM) with the ratio of FM to PM being proportional to the modulating frequency.

Neutrinos are technically equivalent to FM broadcast signals except that neutrinos come in discontinuous wave packets. When a neutrino bounces off of an atom, the near force lines phase modulate the wave. Since neutrinos are so small, they bounce off all of the atoms of molecules thereby picking up information as to the complexity of molecules. The pattern of information is in the form of phase modulated spread spectrum coding with a bandwidth an estimated ten to the tenth times that of the radio spectrum.

It is interesting to estimate the frequency bandwidth of neutrino light. An electron is $10^{-14}$ meters in diameter. The highest possible frequency for a neutrino is then $3 \times 10^8/10^{-14} = 3 \times 10^{22}$. Light changes frequency approximately by a factor of 2 from infra red to ultra violet. Let us assume that neutrinos do the same, giving a neutrino bandwidth of $1.5 \times 10^{22}$. If the neutrino is phase modulated by atoms off which it has bounced this is an effective distributed modulation over this entire bandwidth. The number of bits of information that neutrino light can then carry is effectively infinite. That is, it is a quantized infinity! Surely enough bandwidth to carry information describing all life forms of the universe. Can this information then direct the combination of atoms of hydrogen, carbon and oxygen into life forms producing the range of hydrocarbons found, say in deep oil wells? It is known that hydrocarbons are formed by a spectrum of bacteria that form methane from atoms, gasoline from methane, oils from gasoline, and tars from oils. The basic atoms required are apparently a product of nuclear reactions deep within the Earth. Again all these results may be coded in neutrino information which drive the reactions.

We believe that infra red light, photon light, ultraviolet light, Xray light and neutrino light are all vibrations of the electromagnetic field, differing only in their frequency.

The greatest flow of neutrinos to the surface of the Earth comes from the Sun. A second source is from the center of the Earth. A third source is from nuclear reactors on Earth and a remainder comes from other parts of the universe. The following information is derived regarding neutrinos from the Sun.

The density at the surface of the Earth from solar neutrinos may be calculated as follows:

The number of neutrinos from the Sun is $200 \times 10^{36}$/sec. (as per the Sudbury Neutrino Observatory).

The Sun is $1.5 \times 10^{11}$ meters from the Earth.

The area of a sphere at Earth distance from the Sun is:

$$4\pi \times (1.5 \times 10^{11})^2 = 2.8 \times 10^{23} \text{ square meters.}$$

Thus the number of neutrinos coming to a square meter of surface on Earth from the Sun is:

$$N_E = (200 \times 10^{36})/(2.8 \times 10^{23}) = 7.14 \times 10^{14} \text{ per second.}$$

This converts to 71.4 billion per second per square centimeter.

The rate of 71.4 billion per second per square centimeter agrees quite well with a value found in an article in the August 1999 issue of Scientific American magazine. This article describes a neutrino detector built in Mount Ikenoyama in Japan and gives the figure of 60 billion neutrinos per second per square centimeter from the Sun.

CONCLUSION

These near and far forces operate in the E and H dimensions as first demonstrated by experiments at Nottingham University in the UK and confirmed at the High Magnetic Field Laboratory operated by Florida State University at Gainesville, Fla. In these experiments, strong magnetic fields were used to levitate various items. The composition of the items was found in both experiments to be immaterial and in both cases included a live frog. Levitation occurred when the applied magnetic force field strength exceeded the far force field strength (called gravity) extending from atoms of the items to atoms of the Earth. Herein we provide a scientific explanation of magnetic levitation.

Discussions above related to FIG. 4 describe how neutrinos pick up information regarding material, including living organisms, as they travel throughout the universe. This can explain where the information came from that produces living organisms in hot lava coming from a volcano. It also explains the emergence of life forms around hot vents coming from deep in the Pacific Ocean surrounded by sea water that is totally devoid of life. A further application is in the formation of a set of related microorganisms that produce methane, gasoline, kerosene, light oil, heavy oil and finally tar in oil wells that are pumped out too rapidly for the organisms to get down from the surface. It has long been recognized that there were not enough dinosaurs, etc., to rot and produce Earth's petroleum. Basic elements appear to come from nuclear reactions at the core of the Earth. These seep upward with the neutrinos telling them how to combine.

Does this not imply that knowledge of all life forms of the universe is contained in the neutrino spectrum? Just how neutrinos effect the intelligent combination of elements into life forms is left for future research.

The University of California at Berkeley had a large project at the South Pole, AMANDA, trying to make a neutrino telescope to see distant events in space. They assumed, as is the present thinking in the scientific community, that neutrinos go through anything, including the Earth, in a straight line. We believe otherwise. Moreover, in the case of AMANDA, to be successful the telescope needed to see through a vast source of neutrinos generated by nuclear reactions within the Earth's core. This gave a large neutrino noise background. Furthermore nuclear reactions within the Earth's core may have deflected the neutrinos AMANDA was designed to detect from outer space. These neutrinos were assumed would come through the Earth in a straight line from the North. In actuality the desired neutrinos may have been deflected around the Earth by the effects of the Earth's core and caused to bypass the AMANDA equipment altogether.

Figures:

FIG. 1 The x, y and z dimensions of space from a point "0". Please refer to FIG. 1 of the present application.

FIG. 2 The E space in voltage with quantum spaces between elements equal to the charge on one electron. Please refer to FIG. 2 of the present application.

FIG. 3 A generalized diagram of an electromagnetic wave driven in the general direction Fd by a force F while rotating in the E potential and the H magnetic fields due to a torsional force FQ. Please refer to FIG. 3 of the present application.

FIG. 4 An electromagnetic neutrino wave packet showing phase modulation of rotation due to action of the near force from an adjacent atom. Please refer to FIG. 4 of the present application.

BACKGROUND OF THE INVENTION

Applicant considers that the neutrino light to photon light converter matrix as disclosed in the following application, is unique; while a number of articles describe various projects related to neutrino research, patent and literature searches reveal no specific prior art.

REFERENCES

The following article was downloaded, on Oct. 7, 1996, from website http://snodaq.phy.queensu.ca/sno/sno.html:

THE SUDBURY NEUTRINO OBSERVATORY
The Sudbury Neutrino Observatory (SNO) is a 1000 tonne heavy water Cherenkov detector under construction in INCO's Creighton mine near Sudbury, Ontario. Located 6800 feet below ground, SNO is designed to detect neutrinos produced by fusion reactions in the sun. SNO will provide revolutionary insight into the properties of neutrinos, as well as yielding constraints on reaction mechanisms in the sun. The SNO detector uses 1000 tonnes of heavy water, on loan from the Atomic Energy of Canada Limited (AECL), contained in a 12 m diameter acrylic vessel. Neutrinos react with the heavy water (D2O) to produce flashes of light called Cherenkov radiation. This light is then detected with a Geodesic array of 10,000 photomultiplier tubes surrounding the heavy water vessel. The detector is immersed in light (normal) water within a 30 m barrel-shaped cavity excavated from Norite rock. Location in the deepest part of the mine provides an overburden of rock to shield from cosmic rays. The detector laboratory is immensely clean to reduce background radiation signals which would otherwise hide the very weak signal from neutrinos.

Neutrinos are tiny, possibly massless, neutral elementary particles which interact with matter via the weak nuclear force. The weakness of the weak force gives neutrinos the property that matter is almost transparent to them. The sun, and all other stars, produce neutrinos copiously due to the nuclear decay processes within the core. Since they rarely interact, these neutrinos pass through the Sun and the Earth (and you) unhindered. Other sources of neutrinos include exploding stars (supernova), relic neutrinos (from the birth of the universe) and nuclear power plants (in fact most of the fuel's energy is taken away by neutrinos). For example, the sun produces over two hundred trillion trillion trillion neutrinos every second, and a supernova blast can unleash 1000 times more neutrinos than our sun will produce in its 10-billion year lifetime. Billions of neutrinos stream through your body every second, yet only one or two of the higher energy neutrinos will scatter from you in your lifetime.

Another article, this obtained from a University of California at Berkeley, website http: //amanda.berkeley.edu/, briefly describes a massive neutrino telescope constructed at the south pole in the following excerpt taken from the site as of Jul. 26, 1997:

AMANDA

Antarctic Muon and Neutrino Detector Array

AMANDA is a detector being constructed at the South Pole, whose purpose is to observe high-energy neutrinos from astrophysical sources.

This website is no longer maintained.

A diagram accompanying the article shows 60 meter diameter holes melted in the ice at the North Pole to depths of 1950 meters. An array of these holes each having several hundred photomultiplier tube Cherenkov light detectors for detecting the passage upward of neutrinos that have gone through the Earth from the north.

Another article, dated February 1999, from *Photonics Spectra* magazine describes a neutrino telescope being placed on the ocean floor, off the coast of France, 2.35 km below the surface. These telescopes have 350-m-long strings of photomultiplier tubes as neutrino detectors. There will eventually be an array of eight such strings of detectors. The foregoing project, known as the Antares project, involved scientists from France, Spain, The Netherlands and the UK. Francois Montanet, a physicist at France's Center for Particle Physics has been involved in the project since it began. The article concludes with a summary:

"Neutrinos provide an extremely long-range glimpse into the universe. Because of their high energy, these particles are also messengers of little understood events and objects."

U.S. Pat. No. 5,608,767 by Terhune et al. entitled "NEUTRON-ACTIVATED DIRECT CURRENT SOURCE" describes a device for generating direct current by neutron activation of a plurality of series-connected beta-emitter (nuclear decay electron) cells, located in the out-of-core region of a light water nuclear reactor.

U.S. Pat. No. 4,968,475 by Drukier and Stodolsky entitled "METHOD AND APPARATUS FOR THE DETECTION OF NEUTRINOS AND USE OF NEUTRINO DETECTOR" describes a neutrino detector useful, among other things, for monitoring reactor activity and for prospecting for subterranean deposits of radioactive elements.

U.S. Pat. No. 5,276,717 by Weber entitled "METHOD OF AND APPARATUS FOR GENERATING NEUTRINOS AND/OR ANTINEUTRINOS, A NEUTRINO MODULATION METHOD, AND A NEUTRINO BEAM GENERATOR" describes a neutrino generator and modulator.

SUMMARY OF THE INVENTION

Apparatus for viewing in neutrino light consisting of means for deflecting neutrinos from the top surface thereby creating a detectable differential in neutrino forces from the top to the bottom surface of the apparatus. A matrix of neutrino force detecting elements form pixels of a matrix for viewing in neutrino light. The elements form electrical outputs useable in several ways. A first is suitable for viewing deep underground from satellites and converting the matrix of outputs to a serial digital code for telemetering to ground. A second is to light dots on a visual output screen thereby producing neutrino light to photon light converters. A third is to produce black and white patterns on a liquid crystal display for viewing in reflected light or from a backlighting.

Theories of electrical engineering are given to explain the operation of the apparatus.

BRIEF DESCRIPTIONS OF THE DRAWINGS

FIG. 5 depicts a device for detecting neutrino forces wherein the detector utilizes layered surfaces and a capacitor forming a resonant circuit driven by an oscillator;

FIG. 6a depicts a top view of the device of FIG. 5;

FIG. 6b depicts an end view of the device of FIG. 6a;

FIG. 7a depicts a device utilizing a resonant cavity driven by an oscillator for detecting neutrino forces;

FIG. 7b depicts an end view of the device of FIG. 7a;

FIG. 8a depicts a neutrino power conversion device using a layer of diamagnetic material with a grated surface to produce a differential in force on an electrostrictive body;

FIG. 8b depicts an end view of the device of FIG. 8a;

FIG. 9b depicts a plan view of the matrix device of FIG. 9a;

DESCRIPTION OF THE INVENTION

In order to better describe the preferred embodiment of the invention as described herein various theoretical engineering principles as described herein applied as an adjunct to classical theoretical physics will be addressed. Applicant extends well known principles of electrical engineering to augment widely used theories of physicist.

Figure 1:
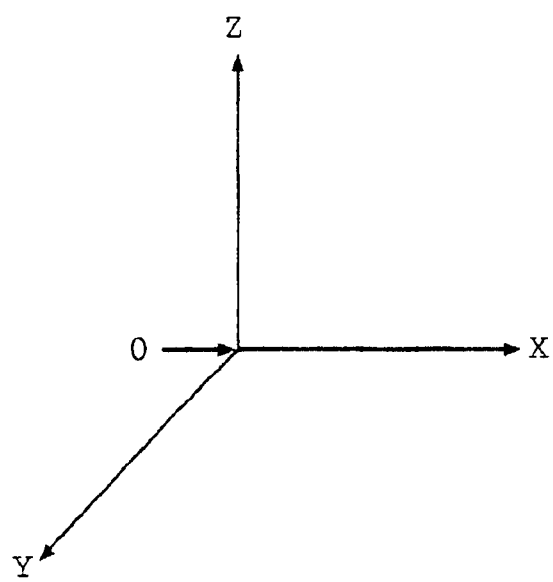
FIG. 1 depicts the x, y, and z dimensions used in the theoretical considerations of the invention.

Engineers use six orthogonal dimensions in their daily work with macro sized systems. These consist of three dimensions of space, one of time, one of electric fields and one of magnetic fields. For purposes of this description these dimensions are labeled x, y, z, T, E and H respectively. FIG. 1 shows the familiar three dimensions of Euclidean space. Time is a dimension familiar to all and is not otherwise illustrated herein.

Figure 2:
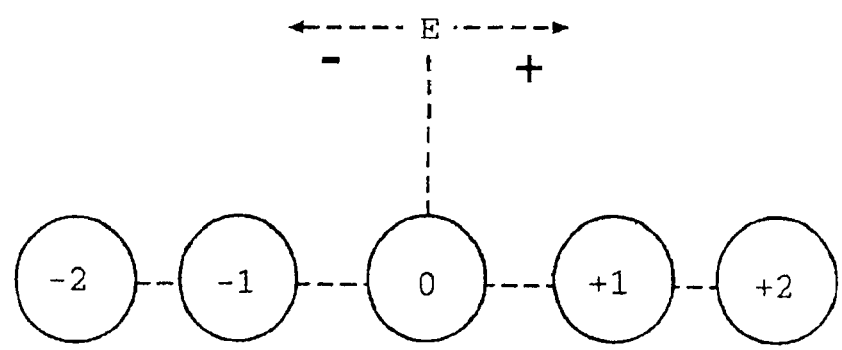
FIG. 2 depicts the E or potential dimension used in the theoretical considerations of the invention.

FIG. 2 illustrates the E (or electric) field with the charge of neutrons at zero, electrons at negative one potential, electron pairs called isoelectroniums at minus two potential, protons at plus one potential and Cooper pairs at plus two potential. The quantum difference between any two items shown in FIG. 2 is one. This implies electric fields of greater potential have a quantum difference in value of one. This is conveniently quantized into the forces produced by a single electron.

The magnetic field B produces forces H well known to the electrical engineer. The elusive magnetic unipole as a magnetic dual of the electron has been sought but so far without result.

Despite contentions by various theoreticians, the present inventor believes that all six dimensions extend from plus to minus infinity. Further, it is asserted herein that there is no lower limit in size for the use of this six dimensional model and related engineering theorems.

A force model is hypothesized herein with forces explaining effects which are observed and used by engineers and others working in the macro world.

Two fields of non-polarized force lines exist emanating from the nucleus of all atoms in the universe. One is termed the "near" force lines and the other the "far" force lines. The near lines from one atom repels the near lines from another atom with a magnitude that falls off to values below the far force lines somewhere in the immediate region outside an atom. The far lines act to pull atoms together with forces that diminish with distances apart. The net effect is to pull atoms of the universe together to a global boundary surrounding atoms within which the near forces exceed the far forces. A vital effect of the near force lines is to prevent atoms from destructively combining. A secondary effect, explained in more detail hereinunder, is to impart information on neutrinos as they bounce around within atomic structures thereby picking up information as to where the neutrinos have been.

Neutrinos are capable, with a very low probability, to penetrate the shielding boundary and destroy an atom. This capability is described in detail herein under.

The far force lines form a force model of the universe applicable from objects on Earth upward throughout the entire universe. The universe is filled with a media consisting of far force lines linking all atoms in the universe. Since each atom has an infinite integer-number of far force lines one must think in terms of far force line density, perhaps a redefinition of aether (ether).

Our bodies are therefore pulled downward by all of the atoms of the Earth giving an effect which we call gravity. Moreover our bodies want to go in straight lines as defined by the force lines. When we go around corners in our automobile we experience sideways forces we call inertia. It is proposed herein that gravity and inertia are but behavioral characteristics of the far force field and do not otherwise exist.

The near force causes visible light (photons) to be reflected from atoms with photon frequency selectivity thereby giving reflected light its color. Herein it is hypothesized that neutrinos are selectively reflected according to their frequency giving color to neutrino light, as detectable in certain experiments.

These near and far forces operate in the E and H dimensions as first demonstrated by experiments at Nottingham University in the UK and confirmed at the High Magnetic Field Laboratory operated by Florida State University at Gainsville Fla. In these experiments, strong magnetic fields were used to levitate items; the composition of the items was immaterial. Levitation occurred when the applied magnetic force field strength exceeded the far force field strength (called gravity) extending from atoms of the items to atoms of the Earth.

It is known that H fields produce forces that cause rotors of motors to turn. E fields also produce forces that attract conductors carrying opposite electrical charges and oppose conductors carrying like charges. Radiated waves, consisting of combinations of the two field types, then carry a force vector with them driving the waves along force lines at the speed of light.

Photons are easy for us to observe as to their frequency; ie. by their color. It is considerably more difficult to observe and measure individual photons. So it is with radio waves with individual "wavelets" that are difficult, but not impossible to produce.

Electromagnetic energy from 60 Hz to photons and neutrinos follow force lines which vibrate in spiral fashion in the E/B fields at the frequency of the waves so as to guide them in the direction of the force lines.

Figure 3:
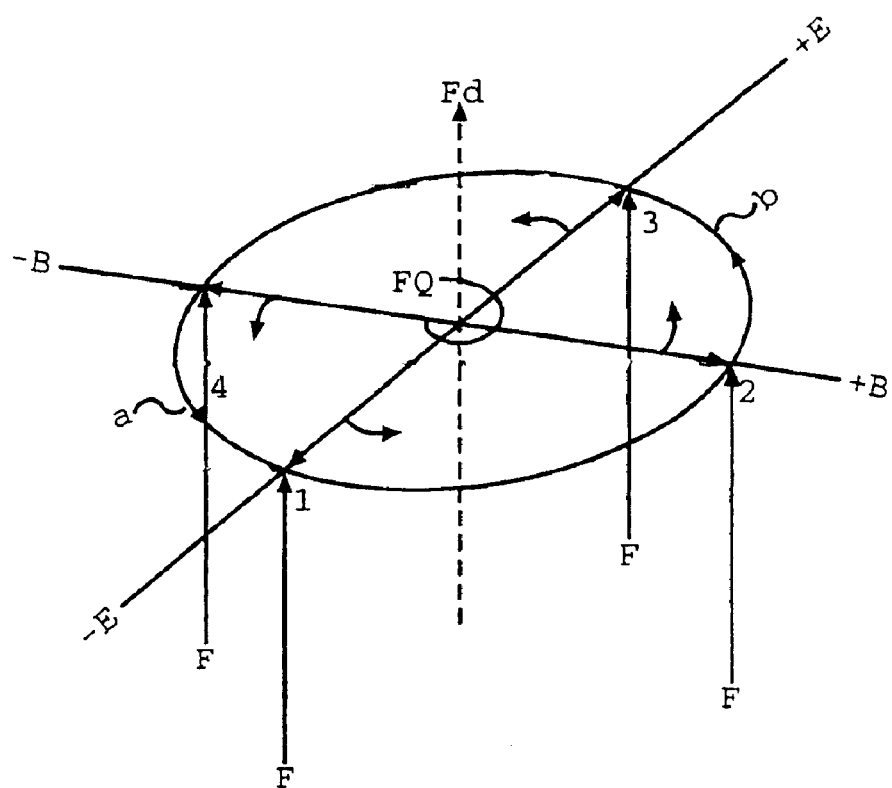
FIG. 3 depicts theoretical considerations for explaining the propagation of an electromagnetic wave.

For purposes of further explanation, FIG. 3 is used to show a generalized model explaining the flow of any electromagnetic wave along power lines, coaxial cables, twisted pairs of copper wires and along far force lines anywhere in space. The force rotates around a circle with phasors rotating around a central direction giving the instantaneous phase relation of the wave.

The engineering force line model for the universe provides a clear direction for electromagnetic waves to follow. Electric power 60 Hz waves follow three phase power lines in the direction of positive-phase-sequence currents. These currents add to a Poynting's vector which provide a force in the direction of power flow along the lines as required to cause the power to flow in the desired direction.

The IEEE standard dictionary of electrical and electronic terms, fifth edition, 1992, provides the following description in reference to positive-phase-sequence symmetrical components: "positive-phase-sequence symmetrical components (of a unsymmetrical set of polyphase voltages or currents of m phases). The set of symmetrical components that have the first phase sequence. That is, the angular phase lag from the first member of the set to the second, from the first member of the set to the second, from every other member of the set to succeeding one, and from the last member to the first, is equal to the characteristic phase difference, or $2\pi/m$ radians. The members of this set will reach their positive maxima uniformly in their designated order. The positive-phase-sequence symmetrical components for a three-phase set of unbalanced sinusoidal voltages (m=3), having the primitive period.

$$e_{a1} = (2)^{1/2} E_{a1} \cos(wt + \alpha_{a1})$$

$$e_{a1} = (2)^{1/2} E_{a1} \cos(wt + \alpha_{a1} - 2\pi/3)$$

$$e_{a1} = (2)^{1/2} E_{a1} \cos(wt + \alpha_{a1} - 4\pi/3)$$

derived from the equation of symmetrical components of a set of polyphase (alternating) voltages. Since in this case r=1 for every component (of the first harmonic) the third subscript is omitted. Then k ia 1 for the 1st sequence and s takes the algebraic values 1, 2, and 3 corresponding to phases a, b, and c. The sequence of maxima occurs in the order a, b, c."

The same IEEE reference describes a Poynting's vector as follows: "If there is a flow of electromagnetic energy into or out of a closed region, the rate of flow of this energy is, at any instant, proportional to the surface integral of the vector product of the electric field strength and the magnetizing force. The vector product is called the Pointing's vector. If the electric field strength is E and the magnetic force is H, then Poynting's vector is given by $$U = E \times H \text{ and } U = E \times H / 4\pi$$

in rationalized and unrationalized systems, respectively. Poynting's vector is often assumed to be the local surface density of energy flow per unit of time."

Figure 4:
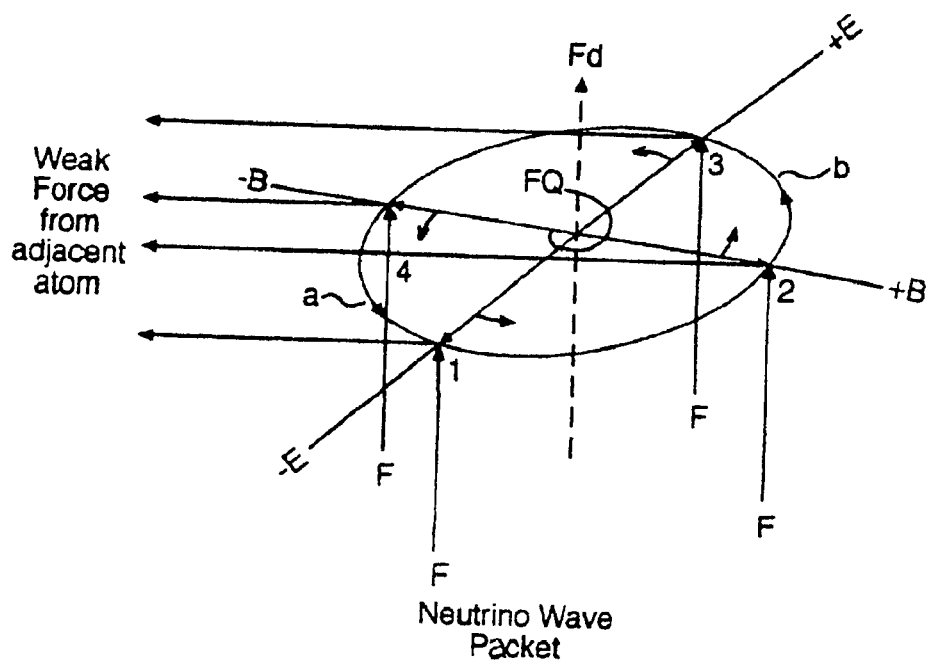
FIG. 4 depicts a force model useful in explaining the propagation of a neutrino wave packet.

FIG. 4 shows a theoretical wave representation of a neutrino. Vector Fd is the neutrino force F multiplied by distance 'd' (along the dotted path line but not otherwise shown) in space giving the direction of travel of a single neutrino packet. Actually Fd does not exist at the center but force F moves around a cylinder of radius Fq by the action of the vector combination of rotating quadrature force vector Fq and the central non-rotating vector Fd. Vector Fq is driven by components of neutrino energy stored on the E/B plane.

Force F starts at point 1, where the energy exists as a negative voltage on the −E axis of an E/B plane. A quarter cycle later, force F is at point 2, and the energy exists as a positive current on the +B axis of the E/B plane. A second quarter cycle later, force F is at point 3, and the energy exists as a positive voltage on the +E axis of the E/B plane. A third quarter cycle later, the force F is at point 4, and the energy exists as a negative current on the −B axis of the E/B plane. A fourth quarter cycle later, force F is back at point 1 of FIG. 4, however, the force F has moved one full neutrino space cycle along the central direction Fd and also one full neutrino period along the time axis. Note that FIG. 4 is a relatively rough isometric depiction of rotation, in three dimensional space, of force F rotating about a cylinder. The movement of the neutrino packet in space and time is difficult to depict graphically. Note, however, that neutrinos move along space/time planes as do we as we walk around our home, drive a car or ride on an airplane. Principles of engineering must merge with and agree with principles of physics.

If a neutrino could be viewed as it comes directly towards you, the force would be seen moving in a circle. Conceptually, if one were small enough and stood in the path of the neutrino, one would be struck by force F from some point on the circle of the force rotation. The experience would be as if hit by a particle equal in diameter to the diameter of the neutrino force circle. The neutrino can, therefore, be said to have a physical size equal to the force diameter. Herein applicant does not believe, as some others believe, that the neutrino has a dual existence, sometimes a wave, sometimes a mass, but applicant believes that neutrinos always are a wave packet as described herein. Applicant believes that the electromagnetic wave model of FIG. 4 is consistent with present theories as well as experimental evidence as to the nature of neutrinos.

Theorem A: An atom has an infinite integer-number of far force lines emanating from protons and neutrons within the nucleus. Some lines link with other atoms forming molecules. Some lines extend across the universe to other atoms, thereby holding the universe together.

Theorem B: An atom has a very large number of near force lines extending in nearly every direction. Each near force line is surrounded by a tube of strong force lines. To reach a near force line of an atom, a neutrino must travel along a far force line that has linked with a near force line within such a tube. In the rare event that this occurs, the atom is annihilated with a burst of energy.

Normally a neutrino is repelled into a redirected path past the atom being phase modulated by the near force lines as it passes. At the same time, the neutrino gives a tiny nudge to the atom contributing to the random atomic movement known as 'Brownian'.

Theorem C: Neutrinos have apparent dimensions in space equal to the diameter of their rotation of force field. They carry a force in some experiments acting as effective mass and a centrifugal force equal to the rotating force creating the force circle at the frequency of the wave packet. Should one be able to stop a neutrino, however the energy and mass would be precisely zero since the neutrino would then no longer exist.

As is well known by radio engineers, that the term FM is inexactly used to describe the well known FM radio band transmissions. Actually phase modulation (PM) of a fixed carrier frequency is used which produces an equivalent frequency modulation (FM) with the ratio of FM to PM being proportional to the modulating frequency.

Neutrinos are technically equivalent to FM broadcast signals except that neutrinos come in discontinuous wave packets. When a neutrino bounces off of an atom, the near force lines phase modulate the wave. Since neutrinos are so small, they bounce off all of the atoms of molecules thereby picking up information as to the complexity of molecules. With the color differences in neutrinos, the pattern of information is in the form of phase modulated spread spectrum coding.

Theorem D: As neutrinos pass atoms, existing individually, as a part of a molecule in a gas, or as a part of a very complex molecule such as DNA molecules, they pick up information as to patterns of atoms. This is accomplished as a phase modulation, PM, of the time rate of rotation of force F about its circle as shown in FIG. 4.

Theorem E: The information bandwidth of neutrino light is many times that of photon light or of the radio frequency spectrum.

While, as humans, we see only in photon light over a relatively small band of the electromagnetic spectrum, we are all familiar with night vision devices used primarily by the military to see at night using infra red light.

We are also familiar with Xray light used by our doctors to see inside of our bodies. Here the Xray film converts the Xray light to a form that we can see in photon light.

We are also familiar with seeing in ultraviolet (UV) light. Our hands may sometimes be stamped with invisible ink. The ink fluoresces in UV light. While we cannot see the UV light we do see the photon light produced by the fluorescence.

Thus it is with neutrino light which is unique in several ways:

1. The amount of neutrino light is immense; far greater than the photon light from the sun.
2. Neutrino light is harmless to humans.
3. Neutrino light passes easily through solid material including the earth and is therefore valuable is seeing deep underground.
4. Neutrino light picks up information about the material that it has passed through.

Theorem F: Infra red light, photon light, ultraviolet light, Xray light and neutrino light are all vibrations of the electromagnetic field, differing only in their frequency.

These theorems together with the present invention are useful as the basis for developing a satellite device capable of seeing deep underground resolving tunnels, caves and a range of underground facilities and telemetering three dimensional views to earth.

Referring to the article from The New York Times for Tuesday, Jun. 16, 1998 applicant contends that many neutrinos follow strong force lines leading to any atom in the universe, imparting their force of motion on the atom and otherwise bouncing away without stopping. The atom moves randomly in response to these hits in what is well known as Brownian motion. In the experiment described in the New York Times article cited above it is applicants contention that a very slight beaming of neutrinos was created by the experiment. The result was a very slight bias in the Brownian motion in the direction of measurement interpreted by the experimenters as evidence of mass of the neutrino. Applicant further believes that, as with gravity, mass exists only as a behavioral attribute of the force field. To that extent, therefore, neutrinos do have the characteristic of what is generally called mass.

This invention expands the concepts described by the New York Times article cited above into a useful device for converting neutrino energy into electric energy capable of producing outputs from photon emitters.

The greatest flow of neutrinos to the surface of the Earth comes from the Sun. A second source is from the center of the Earth. A third source is from nuclear reactors on Earth and a remainder comes from other parts of the universe. Applicant has derived the following information regarding neutrinos from the Sun. The density at the surface of the Earth from solar neutrinos may be calculated as follows:

The number of neutrinos from the Sun is $200 \times 10^{36}$/sec. (as per the Sudbury Neutrino Observatory information quoted above.)

The Sun is $1.5 \times 10^{11}$ meters from the Earth.

The area of a sphere at Earth distance from the Sun is:

$$4\pi \times (1.5 \times 10^{11})^2 = 2.8 \times 10^{23} \text{ square meters.}$$

Thus the number of neutrinos coming to a square meter of surface on Earth from the Sun is:

$$N_E = (200 \times 10^{36})/(2.8 \times 10^{23}) = 7.14 \times 10^{14} \text{ per second.}$$

This converts to 71.4 billion per second per square centimeter. An article in the August 1999 issue of Scientific American magazine describes a neutrino detector built in Mount Ikenoyama in Japan and gives the figure of 60 billion neutrinos per second per square centimeter from the Sun.

Publications from research laboratories studying particle physics in general are concerned with an array of types of neutrinos and related particles. Herein I am interested in using whatever comes along as a tool to use in place of photon light to "see" under the surface of the earth. Applicant is of the opinion that neutrinos are electromagnetic waves that will follow force lines. Moreover it is necessary to deflect only a very minute fraction of the neutrinos passing through one side of our inventive device and out the other side to obtain a differential in force for operation of the device.

Quantum mechanics resorts to hypothesizing an infinite number of dimensions in modeling the inside of the atom which have no experiential extension into the macro world of theoretical engineering. Some experiments require explanation of the emergence of an electron from within an atom. Physicists must annihilate the electron and then recreate it once it emerges from the atom. Annihilation and creation are not matched in the experience of theoretical engineers.

The unified field theory presupposes the existence of gravity as a force within the universe. The present inventor hypothesizes a force model of the universe which provides a lucid explanation of the force called gravity while implying that gravity as such does not exist. This engineering hypothesis explains engineering experiments first carried out at Notingham University and replicated at the high magnetic field laboratory operated by the University of Florida. In these experiments, magnetic forces exceeded the present inventors hypotheses of far force lines attracting atoms of objects to the Earth thus levitating objects of various nature including a live amphibian (a frog in both experiments). Here the engineer is in conflict with the physicists unified field theory. Gravity is one of the fields to which the unified field theory is not applicable.

Experts may soon be capable of combining the laws of classical physics with the laws of engineering to generate more complete explanations of nature from the atom to the universe.

The present invention consists of two components. The first component comprises apparatus for deflecting neutrinos around the bottom surface of said apparatus thus reducing neutrino forces on anything attached to the bottom surface. The second component, a multi-layered neutrino force detecting slab attached to the bottom surface of said first component, then operates on differences in reduced neutrino forces on said slab's upper surfaces as compared to normal neutrino forces on lower surfaces within said slab.

FIGS. 5, 6a, 6b, 7a, 7b, 8a and 8b describe three alternative first component devices. FIGS. 5, 6a and 6b describe a resonant structure driven at resonance by an oscillator 8 operating at the resonant frequency. The resonant structure consist of an inductance made up of bottom surface 2 together with tapered leads 5 and 6 to capacitor 1. Said oscillator connects to said structure by wires 9 and 10. These connect at points where the impedance of the resonant structure matches the impedance of oscillator 8 for most efficient transfer os oscillator 8 power to said structure. Some neutrinos follow electromagnetic force lines oscillating from one side to the other thus creating an oscillating unbalance in force on attached slab 3 from the top surface of the slab to lower surfaces as seen in FIGS. 5 and 6b.

FIGS. 7a and b show a resonant cavity 20 caused to resonate by microwave energy from oscillator 15 with a coaxial connection to an antenna 16 within the cavity. Here again some neutrinos follow electromagnetic force lines within the cavity oscillating from to one side to the other thus creating an oscillating unbalance in force on attached slab 3 from the top surface of the slab to lower surfaces as seen in FIGS. 7a and b.

FIGS. 8a and b show a device having a top surface 11 of diamagnetic material such as crystallin bismuth which tends to inhibit passage of neutrinos. Moreover the top surface is formed with Fresnel groves as in a slice of a cylindrical lens. These groves deflect neutrinos to one side or the other by the slanted surfaces thereby reducing neutrino forces imparted on the top surface 2 of attached slab 3.

Material exhibiting the piezoelectric effect is chosen for detection of neutrino forces. The IEEE Standard Dictionary of Electrical and Electronic Terms IEEE Std 100-1992 gives the following definition: "piezoelectric effect. Some materials become electrically polarized when they are mechanically strained. The direction and magnitude of the polarization depend upon the nature and amount of the strain, and upon the direction of the strain. In such materials the converse effect is observed, namely, that a strain results from the application of an electric field."

Figure 9A:
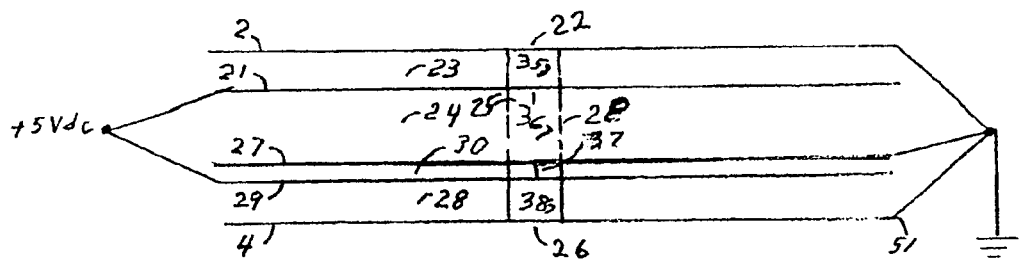
FIG. 9a depicts an edge view of a dot matrix neutrino light to photon light converting device.

FIGS. 9a, 9b, 10, 11a and 11b describe the second component, a neutrino force detecting slab with alternative ways o outputs. FIG. 9a shows an edge view of slab 3 of FIGS. 5, 7a and 8a in greater detail. Layer 2 is the upper surface of slab 3 attached to one selected first component, covered with a conductive material such as gold foil. Neutrino light detector devices 25 have common upper end conductor dots 22 on layer 2 thus connected together as a part of a common circuit ground. Conductive layer 21 carries +5 Vdc to nano-current amplifier 36 and is insulated from layer 2 by insulating film 23. The neutrino light detectors 25 are located in holes 28 through semi-insulator 24. Conductive layer 27 forms a common circuit ground for current amplifiers 36. A small current flows from layer 21 to layer 27 through semi-insulator 24 thus forming shields for amplifier 36. Conductive layer 29 carries +5 Vdc for current amplifiers 38 and is insulated from layer 27 by insulating foil 30. Ground layers 2, 27 and 4 are connected to a single point ground connection to a power supply. Layers 21 and 29 are connected to a single +5 Vdc connection to a power supply. These single point connections and multiple ground surfaces isolate amplifiers 36 from amplifiers 38 to prevent feedback at high gain.

Figure 9B:
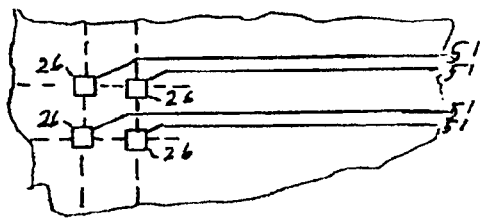

FIG. 9b is a plan view of the device shown in FIG. 9a showing output dots 26 with connections from the dots brought out as foil paths on ground layer 4.

Figure 10:
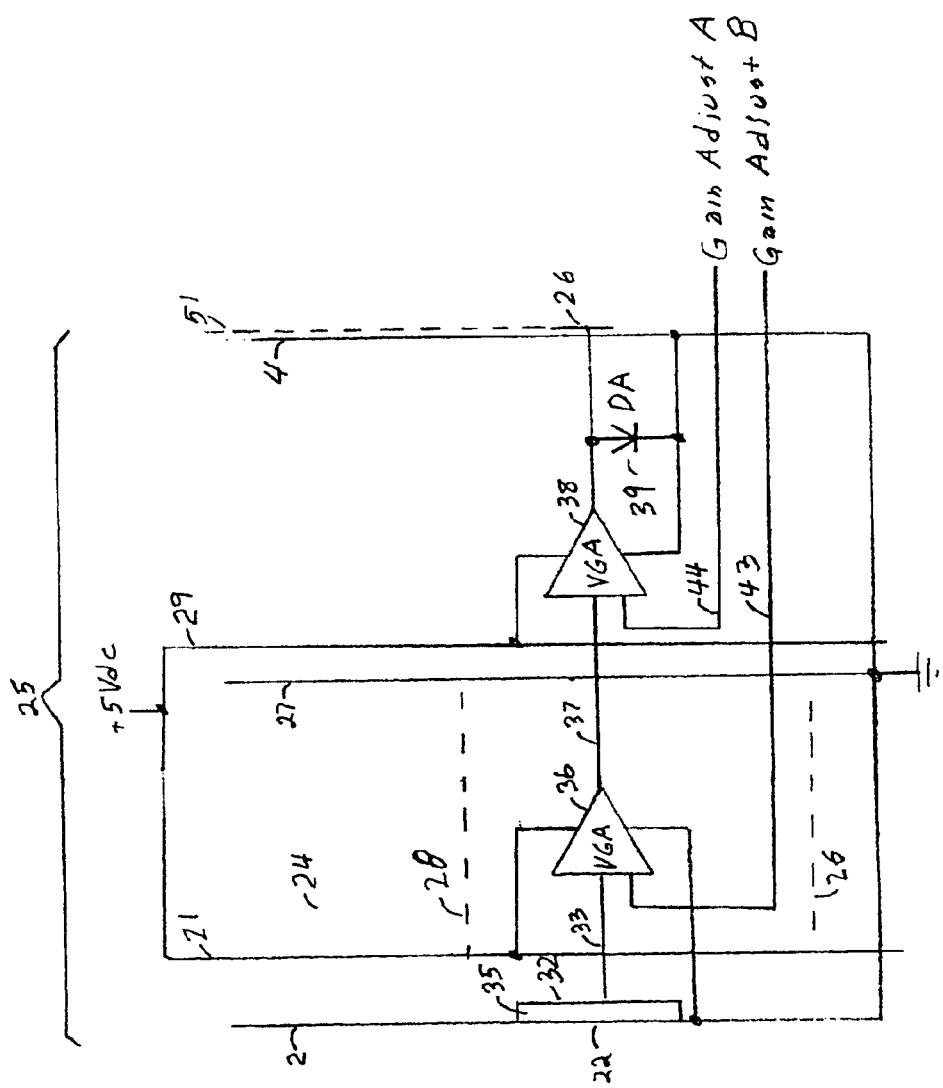
FIG. 10 depicts an amplifier circuit for one element of the matrix device of FIGS. 9a and 9b.

FIG. 10 shows common circuit ground layer 2 providing common circuit ground for nano-current amplifiers 36. Surface 21 supplies +5 Vdc to amplifiers 36. Piezoelectric devices 35 forms neutrino force input dots 22 on surface 2 with a first conductive surface connected to common ground 2. Said first conductive surface receives neutrino forces reduced by action of the first component device to which it is attached. An opposing second conductive surfaces 32 receives non-reduced neutrino forces and is connected by connection 33 to the input of variable gain nano-current amplifier 36 (VGA 36) thereby supplying currents induced on piezoelectric devices 35 by differentials in neutrino forces. Piezoelectric devices produce positive and negative pulses of current on changes in stress. It is the nature of amplifiers 36 and 38 to amplify only positive currents.

The output of Amplifier 36 is connected by connection 37 to the input of variable gain amplifier 38 for further amplification of nano-currents from neutrino forces input to VGA 36. Surface 29 supplies +5 Vdc to variable gain amplifier 38 (VGA 38) and surface 4 provides the ground return. Output dots 26 are driven from outputs of VGAs 38 and form pixels for viewing in neutrino light. Output voltages are limited by one or more series diodes Da 39. Dots 26 are brought to external connection points by foil paths 51 in ground layer 4.

Figure 11A:
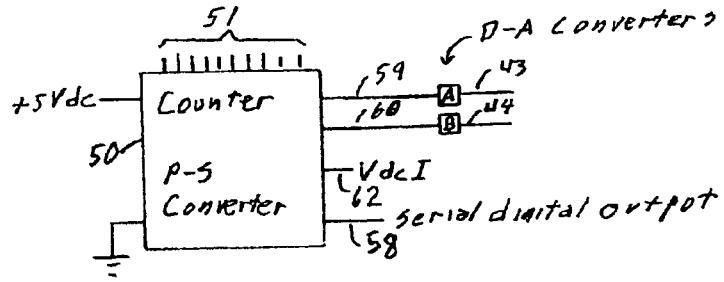
FIG. 11a depicts a counter and converter device for converting matrix outputs to serial digital signals.

FIG. 11a shows connections 51 from pixel dots 26 connected to a counter. In applications for viewing in neutrino light from satellites. Dots 26 form a matrix of voltages. Each one of this matrix of dots 26 is connected by connections 51 to one of the inputs of processor 50 containing a parallel to serial digital converter. The serial digital output is available from device 50 output 58 for transmission by existing satellite digital telemetry to the ground where the signal is converted to a matrix either for viewing or for processing by computers.

Figure 11B:
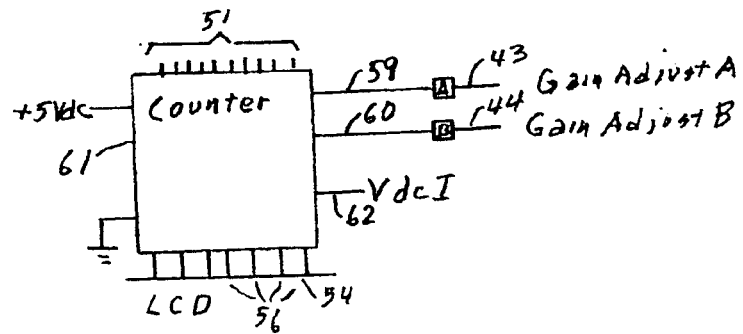
FIG. 11b depicts a counter device for forming a matrix of pixels on an LCD display.

FIG. 11b illustrates connecting the array of output voltage dots 26 with parallel connections 51 to an liquid crystal display (LCD) display 56 capable of causing dots to turn from white to black for direct viewing by reflected light or by backlighting 54 depending on the choice of display.

Both device 50 of FIG. 11a and device 61 of FIG. 11b output signal VdcI (Interrupted signal Vdc) used to provide interrupted dc power to microwave oscillator 8 of FIG. 6a or microwave oscillator 15 of FIG. 7a. The counters in devices 50 of FIG. 11a count the "ones" in the binary serial digital output 58 for determining the portion of dots 26 having voltages above a threshold. In device 61 of FIG. 11b the connections 51 from dots 26 are scanned and ones are counted for determining the portion of dots 26 having voltages above a threshold. Outputs 59 and 60 of both FIGS. 11a and 11b drive digital to analog converters A and B respectively. Analog output voltages on connections 61 and 62 from analog converters A and B respectively form Gain Adjusts A and B fed as shown on FIG. 10 to VGA 36 by connection 43 and VGA 38 by connection 44. The feedback connections adjusts the amplifier gains seeking a balance wherein half of the dots are above said threshold. An effective grey scale of color from white to black is produced by the rate of flashing of the dots on display 56 from white to black.

ADVANTAGES OF THIS INVENTION

The ability to see further underground than with present underground radar technology.

Easy visualization of land mines regardless of materials used.

Detailed underground exploration for valuable material.

I claim:

1. Apparatus for viewing in neutrino light, said apparatus comprising in combination:
   a) an electrically oscillating resonant structure for deflecting neutrinos first to one side and then the other and having a lower conductive surface,
   b) said lower conductive surface forming the upper surface of an attached neutrino force differential detecting slab,
   c) a piezoelectric device which has a first and a second conductive surface,
   d) said first conductive surface connected to said upper surface of a neutrino force differential detecting slab,
   e) current amplifying device with circuit ground connected to said first conductive surface,
   f) current amplifying device input connected to and receiving current input from said second conductive surface,
   g) said current amplifying device forming an output voltage, and
   h) a matrix of pixel elements each consisting of a said piezoelectric device connected to a said current amplifying device thereby forming pixels of said neutrino light viewing apparatus.

2. Devices as in claim 1 further comprising in combination:
   a) said oscillating resonant structure formed by an inductance resonant with a capacitor,
   b) a portion of said inductance which forms said lower surface of said electrically oscillating resonant structure,
   c) a remaining portion of said inductance which connects to said capacitor, and
   d) an oscillating device which drives said oscillating resonant structure at its resonant frequency.

3. Devices as in claim 1 further comprising in combination:
   a) a resonant microwave cavity,
   b) an antenna that drives said resonant microwave cavity at its resonant frequency,
   c) an oscillating device which drives said antenna at the resonant frequency of the cavity, and
   d) said cavity has a lower conductive surface.

4. Devices as in claim 1 further comprising in combination:
   a) layers of conducting material which furnish dc voltages for operation of said current amplifying devices, and
   b) layers of conducting material which furnish ground returns for said dc voltages.

5. Devices as in claim 2 further comprising in combination:
   a) oscillating device which forms square wave pulses,
   b) connections to said square wave oscillating device which drives said oscillating resonant structure at its resonant frequency causing the oscillating resonant structure to switch on and off.

6. Devices as in claim 5 further comprising in combination:
   a) conductive paths which connect said matrix output voltages to digital counters and processors,
   b) said processor which determin s the portion of said output voltages that are above a set threshold,
   c) feedback m ans to said current amplifying device adjusting the amplifier gain seeking a balance wherein half of the pixels are above said threshold.

7. Devices as in claim 6 further comprising in combination:
   a) conversion of voltages on said conductive paths to a digital serial string, and
   b) telemetering means for transmitting said matrix as a digital signal wherein "ones" represent pixels above said threshold and "zeros" represent pixels below said threshold.

8. Devices as in claim 2 further comprising in combination:
   a) LCD display means, and
   b) electrical connections between output voltages on said matrix and said LCD display so that voltages which are above said threshold create a black spot.

* * * * *